United States Patent
Chung et al.

(10) Patent No.: US 10,081,863 B2
(45) Date of Patent: Sep. 25, 2018

(54) THIN-FILM DEPOSITING APPARATUS

(71) Applicant: Samsung Display Co., Ltd., Yongin, Gyeonggi-Do (KR)

(72) Inventors: Kyung-Hoon Chung, Yongin (KR); You-Min Cha, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 901 days.

(21) Appl. No.: 14/224,006

(22) Filed: Mar. 24, 2014

(65) Prior Publication Data
US 2015/0114293 A1   Apr. 30, 2015

(30) Foreign Application Priority Data
Oct. 30, 2013   (KR) .................. 10-2013-0130457

(51) Int. Cl.
*C23C 14/04* (2006.01)
*C23C 16/04* (2006.01)
*C23C 14/50* (2006.01)
*C23C 16/458* (2006.01)

(52) U.S. Cl.
CPC ............ *C23C 16/042* (2013.01); *C23C 14/04* (2013.01); *C23C 14/042* (2013.01); *C23C 14/50* (2013.01); *C23C 16/04* (2013.01); *C23C 16/4583* (2013.01)

(58) Field of Classification Search
CPC ... C23C 14/0005; C23C 14/04; C23C 14/042; C23C 14/044; C23C 16/04; C23C 16/042; C30B 25/04
See application file for complete search history.

(56) References Cited

U.S. PATENT DOCUMENTS

| | | | | |
|---|---|---|---|---|
| 6,451,114 B1* | 9/2002 | Stevens | ............ | H01L 21/67051 118/319 |
| 2003/0224109 A1* | 12/2003 | Kang | ............ | C23C 14/50 427/282 |
| 2009/0124033 A1* | 5/2009 | Moriyama | ............ | C23C 14/042 438/29 |
| 2010/0212596 A1* | 8/2010 | Eida | ............ | C23C 14/042 118/729 |
| 2012/0237682 A1* | 9/2012 | Hong | ............ | C23C 14/042 427/282 |

FOREIGN PATENT DOCUMENTS

| | | |
|---|---|---|
| KR | 10-2003-0085188 A | 11/2003 |
| KR | 10-2005-0091919 A | 9/2005 |
| KR | 10-2009-0061971 A | 6/2009 |
| KR | 10-2011-0064249 A | 6/2011 |
| KR | 10-2013-0019337 A | 2/2013 |

* cited by examiner

*Primary Examiner* — Aiden Lee
(74) *Attorney, Agent, or Firm* — Lewis Roca Rothgerber Christie LLP

(57) ABSTRACT

A thin-film depositing apparatus including a mask, and a chucking unit for adhering the mask to a surface of a substrate, wherein the chucking unit includes a plurality of magnet units that contact another surface of the substrate by independently rising or falling by using their weight and thus are magnetically combined with the mask.

7 Claims, 5 Drawing Sheets

THIN-FILM DEPOSITING APPARATUS

CROSS-REFERENCE TO RELATED APPLICATION

This application claims priority to and the benefit of Korean Patent Application No. 10-2013-0130457, filed on Oct. 30, 2013, in the Korean Intellectual Property Office, the disclosure of which is incorporated herein in its entirety by reference.

BACKGROUND

1. Field

One or more embodiments of the present invention relate to a thin-film depositing apparatus for forming a thin film on a surface of a target object by generating steam from a deposition source.

2. Description of the Related Art

During a procedure of forming a thin film for an organic light-emitting display apparatus, a deposition process is frequently used to adhere the thin film on a surface of a substrate by generating steam from a deposition source. That is, a mask is arranged on the substrate, and then the steam from the deposition source passes through an opening in the mask, so that the thin film having a desired pattern is formed on the substrate.

SUMMARY

One or more embodiments of the present invention include a thin-film depositing apparatus.

Additional aspects will be set forth in part in the description which follows and, in part, will be apparent from the description, or may be learned by practice of the presented embodiments.

According to one or more embodiments of the present invention, a thin-film depositing apparatus includes a mask formed with a deposition pattern, and a chucking unit for adhering the mask to a surface of a substrate, wherein the chucking unit includes a plurality of magnetic units that contact another surface of the substrate by independently rising or falling by using their weight and thus are magnetically combined with the mask.

The chucking unit may further include a frame that is disposed at the other surface of the substrate, and each of the plurality of magnetic units may include a ball bushing arranged at the frame, and a magnetic bar arranged to be vertically movable by using its own weight in the ball bushing.

The plurality of magnetic units may be aligned at an equal level.

The plurality of magnetic units may be aligned at different levels.

Some of the plurality of magnetic units which contact a center portion of the substrate may be disposed to be closer to the substrate than other of the plurality of magnetic units which contact sides of the substrate.

The chucking unit may further include pressing units that press the substrate in an opposite direction to a direction in which the plurality of magnetic units are magnetically combined with the mask via the substrate.

Each of the pressing units may have a housing disposed at the frame, a pressing pin arranged in the housing, and a spring for providing elasticity to the pressing pin in a direction the substrate is pressed.

The pressing units may be arranged at four corners of the frame.

The thin-film depositing apparatus may further include a frame ascending and descending unit for ascending or descending the frame.

The frame ascending and descending unit may include wires for supporting the frame, and a driving power source for ascending or descending the wires.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
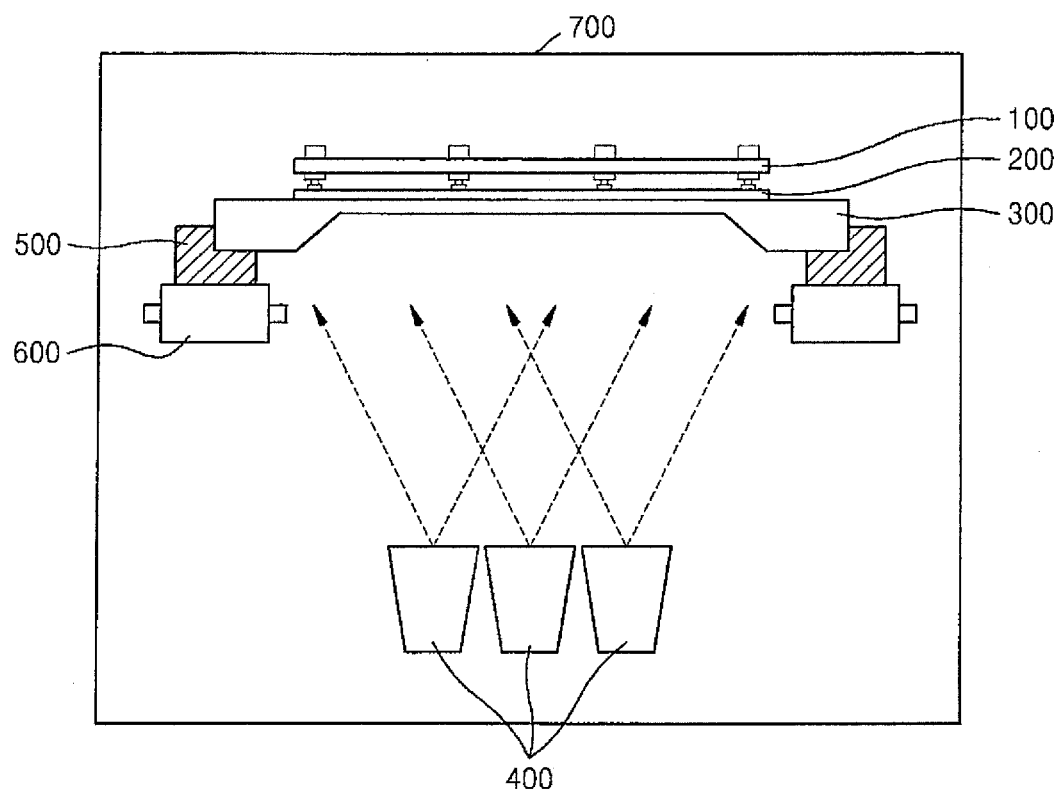
FIG. 1 illustrates a thin-film depositing apparatus according to an embodiment of the present invention.

Reference will now be made in detail to embodiments of the invention, examples of which are illustrated in the accompanying drawings. In this regard, the present embodiments may have different forms and should not be construed as being limited to the descriptions set forth herein. Accordingly, the embodiments are merely described below, by referring to the figures, to explain features of the present invention.

In the accompanying drawings, those components that are the same or are in correspondence are rendered the same reference numeral regardless of the figure number, and redundant explanations are omitted.

Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

In the drawings, for convenience of description, the thicknesses or sizes of elements are exaggerated for clarity, but one or more embodiments of the present invention are not limited thereto.

Also, it should also be noted that in some alternative implementations, the steps of all methods described herein may occur out of order. For example, two steps illustrated in succession may in fact be executed substantially concurrently or the two steps may sometimes be executed in the reverse order.

As used herein, the term "and/or" includes any and all combinations of one or more of the associated listed items.

FIG. 1 illustrates a thin-film depositing apparatus according to an embodiment of the present invention.

As shown in FIG. 1, the thin-film depositing apparatus includes a mask 300 for forming a desired pattern on a substrate 200 that is a deposition target, a chucking unit 100 for adhering the substrate and the mask 300, and a deposition source 400 for spraying a deposition gas in a chamber 700. Reference numerals 500 and 600 denote a tray and a transfer roller, respectively.

When the deposition source 400 sprays the deposition gas in the chamber 700, the deposition gas passes through an opening formed in the mask 300 and then is deposited on the substrate 200 so that a thin film having a predetermined pattern is formed on the substrate 200.

Figure 2:
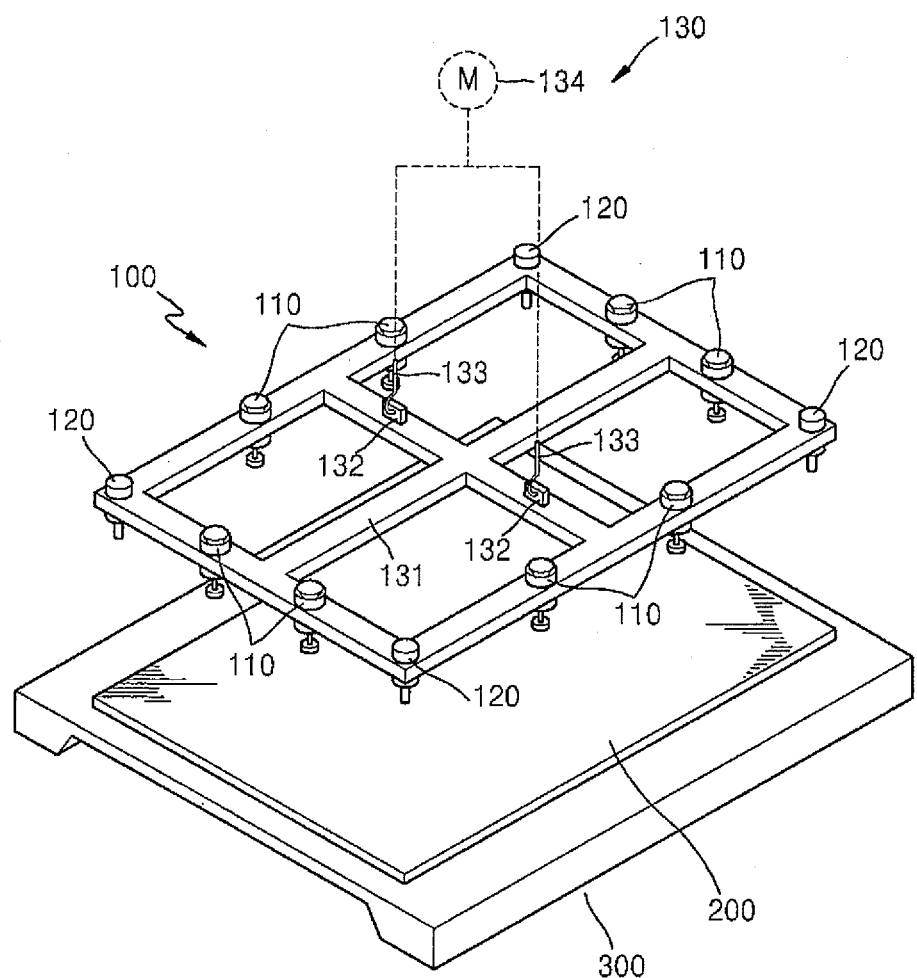
FIG. 2 is a perspective view illustrating a chucking unit of a substrate and a mask in the thin-film depositing apparatus shown in FIG. 1.

Here, as illustrated in FIG. 2, the chucking unit 100 has a structure including a plurality of magnetic units 110. Due to the structure, although the substrate 200 and the mask 300 sag due to their weight, a gap does not occur between the substrate 200 and the mask 300, and the substrate 200 and the mask 300 are further firmly adhered to each other.

Recently, because sizes of the substrate 200 and the mask 300 increase, a center portion thereof may seriously sag due to its weight during a deposition process. Due to the sag, the substrate 200 and the mask 300 are not firmly adhered to each other and a gap occurs between the substrate 200 and the mask 300, such that a deposition error called a shadow may easily occur. However, the chucking unit 100 of the present embodiment may efficiently prevent the aforementioned problem.

Figure 3:
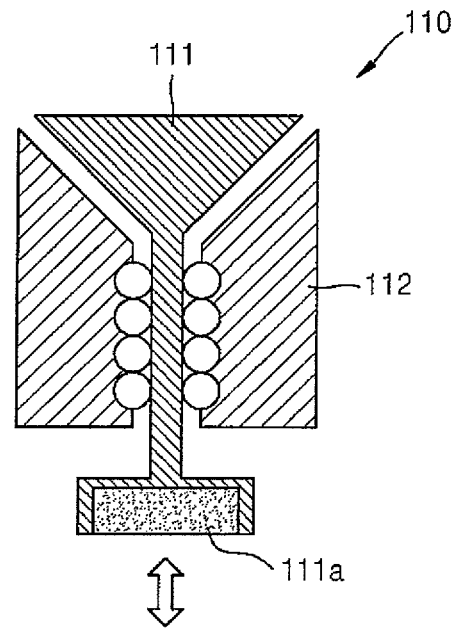
FIG. 3 is a cross-sectional view illustrating a magnetic unit of the chucking unit shown in FIG. 2.

Referring to FIGS. 2 and 3, the chucking unit 100 includes the magnetic units 110 that are arranged at a plurality of locations on a frame 131. As illustrated in FIG. 3, each of the magnetic units 110 includes a ball bushing 112 and a magnetic bar 111 that is supported to be vertically movable by using its own weight in the ball bushing 112. Thus, the magnetic bar 111 may freely rise and fall within a movement range that is acceptable to the ball bushing 112, and the mask 300 formed of a metal material is firmly adhered to the substrate 200 due to a magnetic force of a magnet 111a that is arranged at an end of the magnetic bar 111.

Because the magnetic units 110 independently rise and fall by using their own weight, and are distributed and disposed at several portions on the substrate 200, although the substrate 200 and the mask 300 sag, the magnetic bars 111 may rise to correspond to the sagged shape and the magnetic units 110 may combine with the mask 300.

Figure 5A:
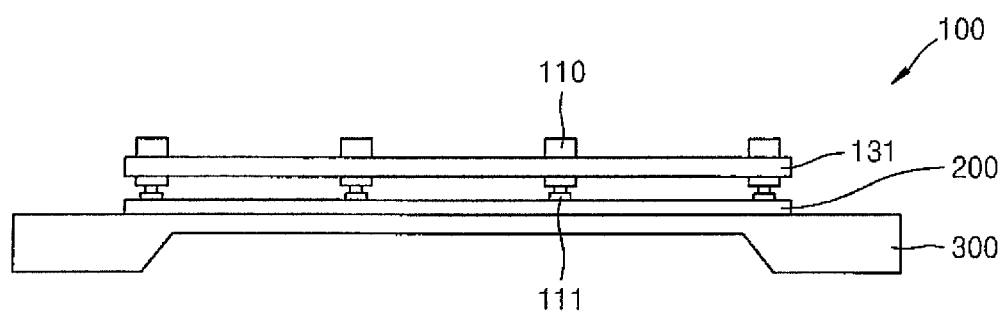
FIGS. 5A and 5B illustrate operational states of the chucking unit shown in FIG. 2.

As illustrated in FIG. 5A, if the substrate 200 and the mask 300 are flat without sagging, the magnetic bars 111 of the magnetic units 110 are positioned at an equal level and contact the substrate 200 and therefore are magnetically combined with the mask 300.

Figure 5B:
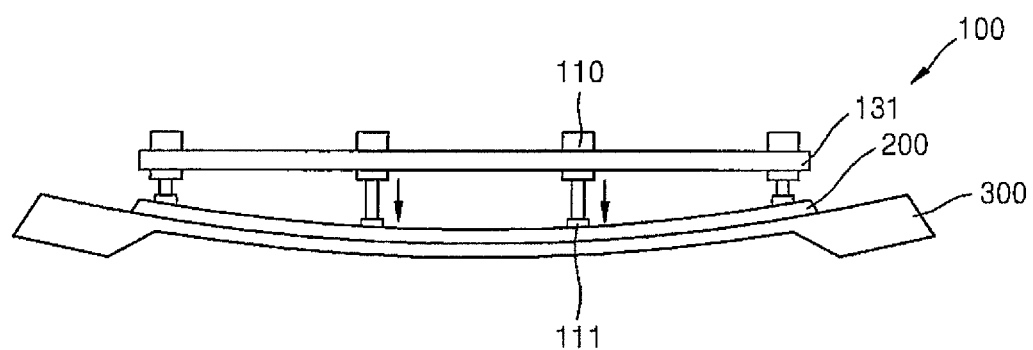

However, as illustrated in FIG. 5B, if a center portion of the substrate 200 and the mask 300 sags, the magnetic bars 111 of the magnetic units 110 that are disposed at the sagged portion further fall, compared to other portions, and therefore contact the substrate 200 and then are magnetically combined with the mask 300. By doing so, although the substrate 200 and the mask 300 sag such that a significant curve occurs at the substrate 200 and the mask 300, the magnetic units 110 are combined to correspond to the sagged shape, so that the sagged central portion of the substrate 200 and the mask 300 may maintain firm adherence between the substrate 200 and the mask 300.

Referring back to FIG. 2, the chucking unit 100 also includes pressing units 120 that press the substrate 200 in an opposite direction to the magnetic direction of the magnetic units 110. Because the pressing units 120 press the substrate 200 in the opposite direction to a direction in which the magnetic units 110 attract the mask 300 toward the substrate 200, the substrate 200 and the mask 300 are firmly clamped between two forces.

Figure 4:
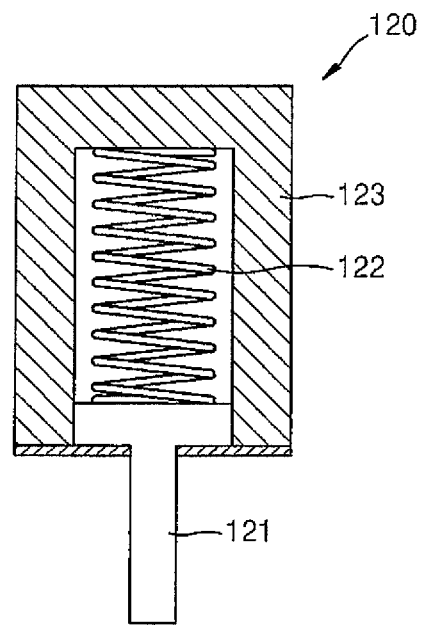
FIG. 4 is a cross-sectional view illustrating a pressing unit of the chucking unit shown in FIG. 2.

As illustrated in FIGS. 2 and 4, a pressing unit 120 is arranged at each of the four corners of the frame 131. The pressing unit 120 has a housing 123, a pressing pin 121 that is vertically movable in the housing 123, and a spring 122 that elastically biases the pressing pin 121 toward the substrate 200. Because the pressing pins 121 press the substrate 200 in an opposite direction by using elasticity of the springs 122, wherein the substrate 200 is drawn due to a magnetic force of the magnetic units 110, the substrate 200 and the mask 300 are firmly clamped between the magnetic force and the elasticity.

A reference numeral 130 denotes a frame ascending and descending unit that makes the frame 131 close to or distant from the substrate 200 by ascending or descending wires 133 to or from a driving power source 134, wherein the wires 133 are combined with link units 132 of the frame 131.

The thin-film depositing apparatus including the chucking unit 100 with the aforementioned structure may be used as below.

First, the substrate 200 and the mask 300 are mounted in the chamber 700, and then the frame 131 descends so that the magnetic bars 111 of the magnetic units 110 are magnetically combined with the mask 300 by having the substrate 200 interposed therebetween. By doing so, the mask 300 is firmly adhered to the substrate 200, and regardless of the flat status as shown in FIG. 5A or the sagging status as shown in FIG. 5B, the substrate 200 and the mask 300 may maintain their firm adherence. Here, the pressing pins 121 of the pressing units 120 press four corners of the substrate 200, and therefore clamp the substrate 200 and the mask 300.

In this status, when a deposition gas is sprayed from the deposition source 400, the deposition gas is deposited on the substrate 200 via an opening (not shown) through the mask 300, so that a thin film with a desired pattern is formed. Obviously, because the substrate 200 and the mask 300 are firmly adhered to each other by using the chucking unit 100, regardless of the occurrence of sagging, a deposition error called a shadow does not occur.

Accordingly, by using the thin-film depositing apparatus, although the substrate 200 and the mask 300 sag due to their weight, the magnetic units 110 that are disposed at several positions rise by their weight along the sagged shape so as to firmly adhere the substrate 200 and the mask 300, so that a deposition error that may occur due to poor adherence between the substrate 200 and the mask 300 may be efficiently prevented.

Figure 6A:
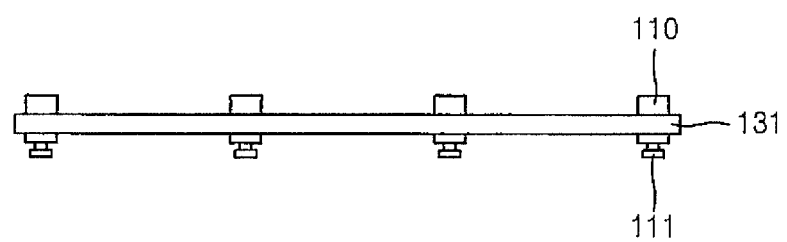
FIGS. 6A and 6B illustrate other embodiments of the chucking unit shown in FIG. 2.
Figure 6B:
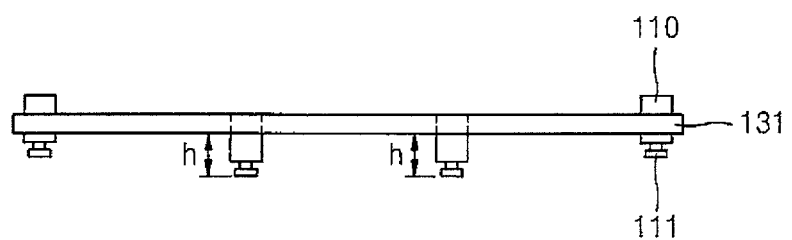

The aforementioned arrangement of the magnetic units 110 may vary. For example, as illustrated in FIG. 6A, all of the magnetic units 110 may be disposed at an equal level so as to correspond to a sagged portion by using a rising or falling value of each of the magnetic bars 111, or alternatively, because a center portion of the substrate 200 mainly sags, as illustrated in FIG. 6B, the magnetic units 110, at positions that correspond to the center portion, may be disposed to be closer to the substrate 200 by an appropriate height h. In this manner, the aforementioned arrangement of the magnetic units 110 may vary.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A thin-film depositing apparatus comprising:
   a mask formed with a deposition pattern, and
   a chucking unit for adhering the mask to a first surface of a substrate, the chucking unit comprising a frame and a plurality of magnetic units coupled to the frame,
   wherein each of the plurality of magnetic units comprises a ball bushing arranged at the frame and a magnetic bar arranged to be vertically movable by weight in the ball bushing, and the magnetic bar is configured to contact a second surface of the substrate opposite the first surface by independently and freely rising or falling by weight to magnetically combine with the mask,
   wherein the plurality of magnetic units comprise a first group of magnetic units and a second group of magnetic units, and are configured to magnetically pull the mask in a first direction toward the frame,
   wherein a body of each of the first group of magnetic units coupled to a center portion of the frame protrudes from the frame in a direction only toward the substrate, and a body of each of the second group of magnetic units coupled to sides of the frame protrudes from the frame in both directions toward the substrate and away from the substrate, and
   wherein, when each of the plurality of magnetic units is in an unextended position, each of the second group of magnetic units has a first protruded distance from a surface of the frame facing the mask and each of the first group of magnetic units has a second protruded distance greater than the first protruded distance from the surface of the frame facing the mask.

2. The thin-film deposition apparatus of claim 1, wherein each of the first group of magnetic units protrudes an equal distance from the surface of the frame facing the mask when each of the plurality of magnetic units are in the unextended position.

3. The thin-film depositing apparatus of claim 1, wherein the chucking unit further comprises a plurality of pressing units coupled to the frame, the plurality of pressing units configured to press the substrate in a second direction opposite to the first direction.

4. The thin-film depositing apparatus of claim 3, wherein each of the pressing units has a housing disposed at the frame, a pressing pin arranged in the housing, and a spring for providing elasticity to the pressing pin in the second direction in which the substrate is pressed.

5. The thin-film depositing apparatus of claim 3, wherein the pressing units are arranged at each corner of the frame.

6. The thin-film depositing apparatus of claim 1, further comprising a frame ascending and descending unit for ascending or descending the frame.

7. The thin-film depositing apparatus of claim 6, wherein the frame ascending and descending unit comprises wires for supporting the frame, and a driving power source for ascending or descending the wires.

* * * * *